US011722805B1

(12) United States Patent
Kinney et al.

(10) Patent No.: US 11,722,805 B1
(45) Date of Patent: Aug. 8, 2023

(54) ELECTRICAL APPLIANCE POWER MONITORING

(71) Applicant: Alarm.com Incorporated, Tysons, VA (US)

(72) Inventors: Abraham Joseph Kinney, Vienna, VA (US); Ronald Byron Kabler, Roselle, IL (US); Aaron Eidelman, Tysons, VA (US); Robert Leon Lutes, Lawrence, KS (US)

(73) Assignee: Alarm.com Incorporated, Tysons, VA (US)

( * ) Notice: Subject to any disclaimer, the term of this patent is extended or adjusted under 35 U.S.C. 154(b) by 249 days.

(21) Appl. No.: 16/841,984

(22) Filed: Apr. 7, 2020

Related U.S. Application Data

(60) Provisional application No. 62/832,084, filed on Apr. 10, 2019.

(51) Int. Cl.
*H04Q 9/00* (2006.01)
*G01R 21/133* (2006.01)
(Continued)

(52) U.S. Cl.
CPC ............... *H04Q 9/00* (2013.01); *G01R 15/18* (2013.01); *G01R 15/202* (2013.01);
(Continued)

(58) Field of Classification Search
CPC ........... H04Q 2209/00; H04Q 2209/10; H04Q 2209/40; H04Q 2209/70; H04Q 2209/80; H04Q 2209/823; H04Q 2209/84; H04Q 9/00; G01R 15/18; G01R 15/202; G01R 15/205; G01R 21/133; G01V 11/00
See application file for complete search history.

(56) References Cited

U.S. PATENT DOCUMENTS 5,256,960 A * 10/1993 Novini ................. G01R 33/028
324/128
8,450,995 B2 * 5/2013 Wagner ................. G01D 21/00
455/67.11
(Continued)

FOREIGN PATENT DOCUMENTS

CA 2743166 A1 * 12/2012 ............... G01D 4/00
EP 1861839 8/2016

*Primary Examiner* — Franklin D Balseca
(74) *Attorney, Agent, or Firm* — Fish & Richardson P.C.

(57) ABSTRACT

A monitoring system that is configured to monitor a property is disclosed. The monitoring system includes a sensor that is configured to generate sensor data that reflects an environmental condition of the property and an electrical monitoring device coupled to an electrical cord that provides power to an electrical device located at the property. The electrical monitoring device is configured to generate electrical data that reflects electricity that flows through the electrical cord. The monitoring system includes a monitor control unit that is configured to: receive, from the sensor, the sensor data; receive, from the electrical monitoring device, the electrical data; and analyze the sensor data and the electrical data. The monitor control unit is configured to: based on analyzing the sensor data and the electrical data, determine a status of the electrical device; and based on the status of the electrical device, perform a monitoring system action.

20 Claims, 6 Drawing Sheets

(51) Int. Cl.
  *G01V 11/00* (2006.01)
  *G01R 15/20* (2006.01)
  *G01R 15/18* (2006.01)

(52) U.S. Cl.
  CPC ......... *G01R 15/205* (2013.01); *G01R 21/133* (2013.01); *G01V 11/00* (2013.01); *H04Q 2209/40* (2013.01); *H04Q 2209/823* (2013.01)

(56) References Cited

U.S. PATENT DOCUMENTS

| | | | |
|---|---|---|---|
| 8,786,412 B2 | | 7/2014 | Ebrom et al. |
| 9,784,774 B2 | * | 10/2017 | Valencic ................ G01R 21/00 |
| 10,003,863 B2 | * | 6/2018 | Louzir .................... H04Q 9/00 |
| 10,580,407 B1 | * | 3/2020 | Sriram ................... G06F 3/167 |
| 10,867,254 B2 | * | 12/2020 | Benazzouz ........... H04L 12/282 |
| 2011/0276289 A1 | * | 11/2011 | Park ..................... G01R 21/133 |
| | | | 702/62 |
| 2015/0102928 A1 | * | 4/2015 | Sirotkin .................. G08B 1/08 |
| | | | 340/541 |
| 2018/0007431 A1 | * | 1/2018 | Sidhu ............... H04N 21/25883 |
| 2022/0193444 A1 | * | 6/2022 | Kerns .................. A61N 5/0621 |

\* cited by examiner

ELECTRICAL APPLIANCE POWER MONITORING

CROSS-REFERENCE TO RELATED APPLICATION

This application claims the benefit of U.S. application Ser. No. 62/832,084, filed Apr. 10, 2019, which is incorporated by reference.

TECHNICAL FIELD

This specification generally relates to property monitoring systems.

BACKGROUND

Residential and commercial properties are equipped with electric appliances that perform various functions.

SUMMARY

According to an innovative aspect of the subject matter described in this specification, a monitoring system is configured to monitor a property. The monitoring system includes a sensor that is configured to generate sensor data that reflects an environmental condition of the property; an electrical monitoring device coupled to an electrical cord that provides power to an electrical device located at the property, the electrical monitoring device being configured to generate electrical data that reflects electricity that flows through the electrical cord; and a monitor control unit. The monitor control unit is configured to receive, from the sensor, the sensor data; receive, from the electrical monitoring device, the electrical data; analyze the sensor data and the electrical data; based on analyzing the sensor data and the electrical data, determine a status of the electrical device; and based on the status of the electrical device, perform a monitoring system action.

According to another innovative aspect of the subject matter described in this specification, an electrical monitoring device is configured to clip to an exterior of an electrical cord that provides power to an electrical device located at a property. The electrical monitoring device includes a sensor assembly configured to output magnetic field strength data that reflects an electrical current through an electrical cord that provides power to an electrical device; and a processing assembly. The processing assembly is configured to receive, from the sensor assembly, the magnetic field strength data; compare the magnetic field strength data to a threshold magnetic field strength; based on comparing the magnetic field strength data to the threshold magnetic field strength, determine a status of the electrical device; and communicate the status of the electrical device to a remote computing device.

These and other implementations can optionally include one or more of the following features, alone or in combination. In some implementations, the sensor is a motion detector that is configured to generate motion data; and the monitor control unit is configured to: receive the sensor data by receiving the motion data; based on the motion data, determine an occupancy of the property; and based on the occupancy of the property and the status of the electrical device, perform the monitoring system action.

In some implementations, the electrical data includes a time duration that the electrical device has been powered on; the monitor control unit is configured to determine that the time duration that the electrical device has been powered on exceeds a threshold time duration; and the monitoring system action includes removing power to the electrical device.

In some implementations, the monitoring control unit is configured to: determine, over a period of time, a trend of electrical data; based on analyzing the sensor data and the electrical data, detect a deviation from the trend of electrical data; and in response to detecting the deviation from the trend of electrical data, perform the monitoring system action.

In some implementations, the monitoring control unit is configured to: receive a status of the monitoring system; based on the sensor data and the status of the monitoring system, determine an expected status of the electrical device; determine that the status of the electrical device deviates from the expected status of the electrical device; and in response to determining that status of the electrical device deviates from the expected status of the electrical device, perform the monitoring system action.

In some implementations, the electrical data includes a binary on or off status of the electrical device.

In some implementations, the electrical monitoring device is removably coupled to an exterior of the electrical cord.

In some implementations, the status of the electrical device is on; and the monitoring system action includes removing power to the electrical device.

In some implementations, the status of the electrical device is off; and the monitoring system action includes providing power to the electrical device.

In some implementations, the monitoring system action includes providing a notification reflecting the status of the electrical device.

In some implementations, the electrical data includes one or more of a time-varying measured current or a time-varying measured voltage of the electrical cord.

In some implementations, the sensor assembly includes one or more of a Hall Effect sensor, a magneto-resistive sensor, or an induction coil sensor.

In some implementations, the electrical monitoring device further includes a voltage sensor configured to output voltage data that reflects a voltage of the electrical cord.

In some implementations, the electrical monitoring device further includes a visual indicator of magnetic field strength.

In some implementations, the remote computing device is a monitor control unit of a monitoring system configured to monitor the property.

In some implementations, determining the status of the electrical device includes: based on determining that the magnetic field strength data exceeds the threshold magnetic field strength, determining that the status is on.

In some implementations, determining the status of the electrical device includes: based on determining that the magnetic field strength data is less than the threshold magnetic field strength, determining that the status is off.

In some implementations, determining the status of the electrical device includes: sampling the magnetic field strength data at a sample rate over a period of time to generate data samples; determining that a number of sequential data samples include magnetic field strength data that is less than the threshold magnetic field strength; and based on determining that the number of sequential data samples include magnetic field strength data that is less than the threshold magnetic field strength, determining that the status of the electrical device is off. In some implementations, the sample rate varies based on the status of the electrical device.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Residents, homeowners, and businesses equip their properties with electrical appliances to perform various functions. It is desirable to know the status of the electrical appliances on a property, such as whether an appliance is on or off, the amount of time that an appliance has been on or off, and the amount of power an appliance is consuming. A device that is easily installed by a resident on the power cable of any electrical appliance can be used to monitor the status of the appliance and communicate this information to a property monitoring system.

Electrical appliance monitoring can be performed by appliance monitors connected to property monitoring systems. In some implementations, monitoring systems can dynamically control and configure devices and components of the property based on the status of electrical appliances. For instance, when left on and unattended, some electrical devices (e.g. electric stoves, space heaters, etc.) can cause fires in homes and lead to significant damage. If the monitoring system detects that an electrical appliance is left on for too long, or is left on when the resident departs the property, the monitoring system can power off the appliance. The monitoring system can also perform actions to alert the resident of the status of the appliance by sending a notification to the resident's computing device. This reminder could prompt a resident to turn off the electrical appliance, preventing a potential fire.

Certain implementations of the disclosed systems, techniques, and methods have particular advantages. For example, some electrical appliances can cause damage by losing power, such as a refrigerator, furnace, or sump pump. In these cases, the monitoring system can determine when an appliance has lost power and is not performing its function. The monitoring system can notify the resident of the loss of power so that the resident can take action to restore power or mitigate the damage.

In another implementation, an appliance monitor may be used to limit the operating time of certain electrical appliances, such as televisions, computers, or video game consoles. The resident of a property may set rules and preferences to limit the operating time of an appliance to a certain number of minutes or hours. When an appliance reaches its time limit, as set by the resident, the monitoring system can power off the appliance and/or send a notification to the resident.

The details of one or more implementations of the subject matter described in this specification are set forth in the accompanying drawings and the description below. Other features, aspects, and advantages of the subject matter will become apparent from the description and the drawings.

Figure 1:
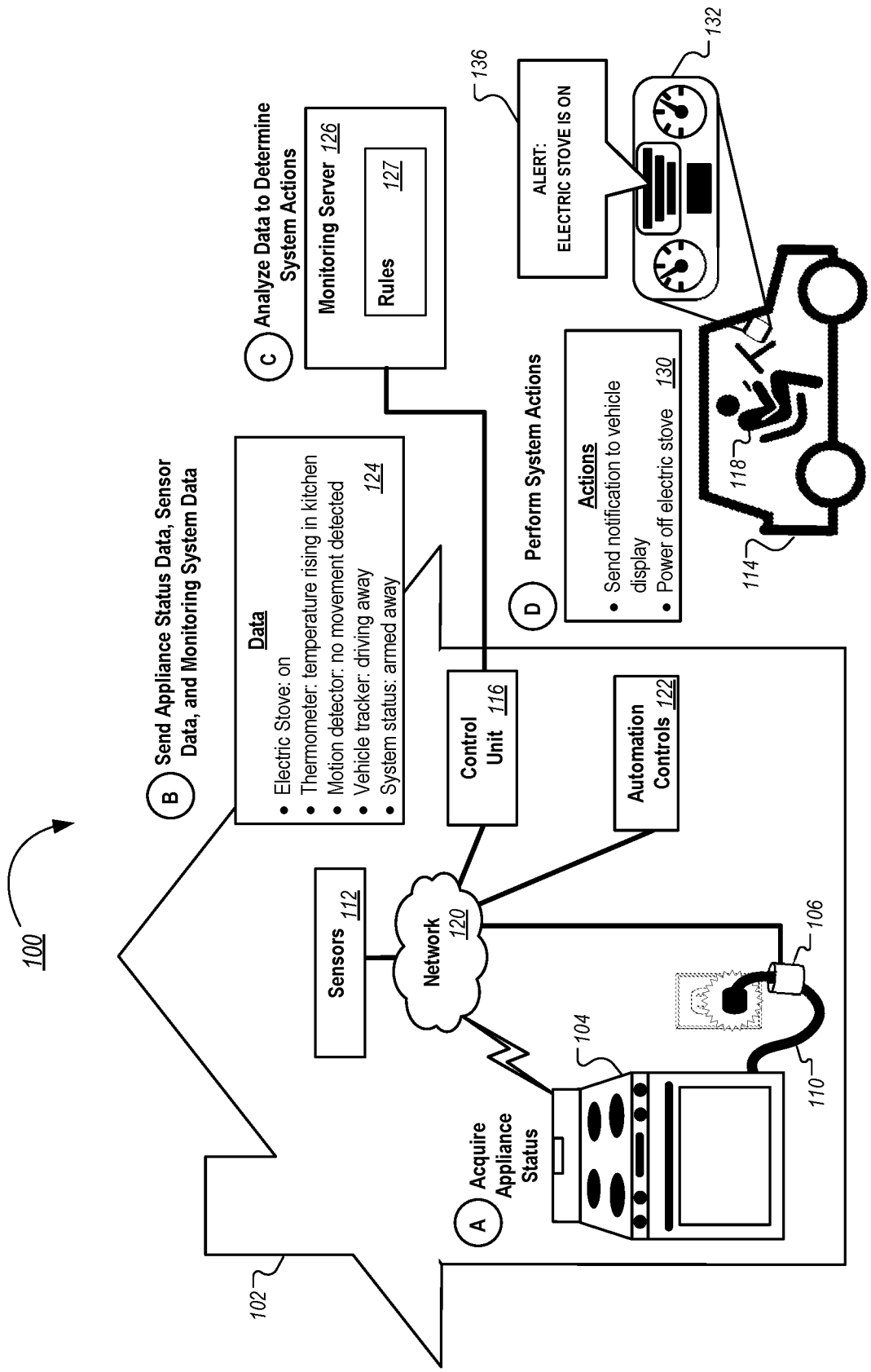
FIG. 1 is a diagram illustrating an example of a system for property control and configuration based on monitoring the status of electrical appliances.

FIG. 1 is a diagram illustrating an example of a system 100 for property control and configuration based on the status of electrical appliances. The system 100 includes a property 102 that has an electric stove 104 installed. The electric stove 104 uses electric power to generate heat. The heat is used to cook food, both on the stove top and inside the oven. If left on and unmonitored, an electric stove 104 can ignite a fire, causing damage to the property 102. An appliance monitor 106 is clipped on to the power cable 110 of the electric stove 104. The appliance monitor 106 measures electrical data that reflects the electricity flowing to the electric stove 104.

The appliance monitor 106 is a clip-on device that can be installed by the resident 118. The device is designed to be easily installed, and does not require professional installation. The appliance monitor 106 can be installed on any electrical cord or power cable 110, whether the power cable 110 plugs into a wall outlet or directly into an electrical junction box. The appliance monitor 106 can be installed externally over the existing power cable 110 for an appliance.

The property 102 is monitored by a property monitoring system. The property 102 can be a home, another residence, a place of business, a public space, or another facility that has an electric stove 104 installed and is monitored by a property monitoring system. The monitoring system includes one or more sensors 112 located at the property 102 that collect sensor data related to the property 102. The property monitoring system has the ability to notify the resident 118 of various anomalies on the property 102. The property monitoring system also has the ability to communicate with and control various devices on the property 102.

In stage (A) of FIG. 1, the appliance monitor 106 determines the status of the electric stove 104. The appliance monitor 106 sends data from the power cable 110 of the electric stove 104 to the control unit 116 through the network 120. The data indicates that the electric stove is powered on. The determination that the electric stove is on may be made by the appliance monitor 106 or by the control unit 116.

Concurrently or at another time, other sensors 112 of the monitoring system may collect sensor data from the property 102. For example, if a resident is preparing a meal, motion detectors may detect movement in the kitchen, and water flow sensors may detect increased water usage from the kitchen sink. Additionally, the temperature of the kitchen may rise while the electric stove 104 is on, and microphones may detect voices speaking in the kitchen. The sensors 112 can also include sensors from around the property 102 such as vehicle tracking devices, door or window lock sensors, utility or resource usage sensors, humidity sensors, light detectors, or other sensors. The sensors 112 send the sensor data to the control unit 116 through the network 120.

The control unit 116 receives data from the appliance monitor 106, and the sensor data from the sensors 112. The control unit 116 can be, for example, a computer system or other electronic device configured to communicate with the appliance monitor 106 and sensors 112. The control unit 116 can also perform various management tasks and functions for the monitoring system. In some implementations, the resident 118 of the property, or another user, can communicate with the control unit 116 (e.g., input data, view settings, or adjust parameters) through a physical connection, such as a touch screen or keypad, through a voice interface, or over a network connection.

The appliance monitor 106 and sensors 112 may communicate with the control unit 116 through a network 120. The network 120 can be any communication infrastructure that supports the electronic exchange of data between the control unit 116, the appliance monitor 106, and sensors 112. For example, the network 120 may include a local area network (LAN). The network 120 may be any one or combination of wireless or wired networks and may include any one or more of Ethernet, Bluetooth, Bluetooth LE, Z-wave, Zigbee, or Wi-Fi technologies.

In stage (B) of FIG. 1, the control unit 116 sends the various data 124 to a remote monitoring server 126, where the data 124 can include the data from the power cables 110 of electrical appliances, and sensor data from the sensors 112. The control unit 116 also sends the configuration of the system to the monitoring server 126, indicating whether the system is armed or disarmed.

The monitoring server 126 may be, for example, one or more computer systems, server systems, or other computing devices that are located remotely from the property 102 and that are configured to process information related to the monitoring system at the property 102. In some implementations, the monitoring server 126 is a cloud computing platform.

The control unit 116 communicates with the monitoring server 126 via a long-range data link. The long-range data link can include any combination of wired and wireless data networks. For example, the control unit 116 can exchange information with the monitoring server 126 through a wide-area-network (WAN), a broadband internet connection, a cellular telephony network, a wireless data network, a cable connection, a digital subscriber line (DSL), a satellite connection, or other electronic means for data transmission. The control unit 116 and the monitoring server 126 may exchange information using any one or more of various communication synchronous or asynchronous protocols, including the 802.11 family of protocols, TCP/IP, GSM, 3G, 4G, 5G, LTE, CDMA-based data exchange or other techniques. In some implementations, the long-range data link between the control unit 116 and the monitoring server 126 is a secure data link (e.g., a virtual private network) such that the data exchanged between the control unit 116 and the monitoring server 126 is encoded to protect against interception by an adverse third party.

In some implementations, various other monitoring system components located at the property 102 communicate directly with the monitoring server 126 (e.g., sending data directly to the monitoring server 126 rather than sending data to the monitoring server 126 via the control unit 116). For example, the appliance monitor 106, the sensors 112, the automation controls 122, or other devices at the property 102 can provide some or all of the data 124 to the monitoring server 126, e.g., through an internet connection.

In some implementations, the control unit 116 processes some or all of the data 124 before sending the data 124 to the monitoring server 126. For example, the control unit 116 may compress or encode the data 124 to reduce the bandwidth required to support data transmission. The control unit 116 can also aggregate, filter, transform, or otherwise process some or all of the data 124.

In the example of FIG. 1, the data 124 includes the data from the power cables of electrical appliances indicating that the electric stove 104 is on. Additionally, sensor data includes motion detector data indicating that there is no movement in the kitchen, thermometer data indicating that the temperature in the kitchen is rising, and flow meter data indicating that no water has recently been used from the kitchen sink. The data 124 also includes vehicle tracking data indicating that the vehicle 114 of the resident 118 is driving away from the property 102. The monitoring system status data indicates that the monitoring system is armed.

In stage (C), the monitoring server 126 analyzes the data 124 received from the control unit 116. For example, the monitoring server analyzes the electrical appliance data indicating that the electric stove 104 is on, the motion detector data indicating no movement in the kitchen, and the thermometer data indicating rising temperatures in the kitchen, to deduce that the electric stove has been left on.

The monitoring server 126 analyzes the data from the power cables of electrical appliances included in the data 124. The monitoring server 126 can use a rules-based system. For example, a rule 127 may state that when the resident 118 is not on the property 102, the electric stove 104 should be off. The monitoring server can deduce that the resident 118 is not on the property 102 based on the monitoring system status set to "armed, away," the motion detectors detecting no motion, and/or the vehicle 114 driving away from the property 102.

In response to determining the status of one or more electrical appliances, the monitoring server 126 determines one or more system actions 130. The rules engine determines the system actions 130 based on one or more rules 127. The rules 127 can be default rules, set in advance by a system administrator. The rules 127 can also be custom rules, set or modified by the resident 118 or another authorized user of the monitoring system. The rules 127 may be general, such that they are applied to more than one property, or they may be specific to the particular property 102. In some implementations, the rules 127 can be customized according to the particular appliance, the time of day, or other factors.

In some implementations, the resident 118 can customize the one or more rules 127 according to his preferences. In some implementations, the resident 118 can set the one or more rules 127 through a software application executing on his mobile device, through a graphical interface provided by a browser or application on a computing device, and/or through interacting with a physical interface of the control unit 116 of the property monitoring system.

The monitoring server 126 can determine any of various actions 130 in response to analyzing the data 124. For example, the monitoring server 126 may determine actions 130 that include sending a notification 136 to a dashboard display 132 in a vehicle 114, sending an instruction to the automation controls 122 to adjust a setting of a connected appliance, sending a command to a sensor 112 to collect and send additional sensor data, sounding an alarm of the property 102, or sending an alert to a third-party, such as security personnel or emergency services.

In stage (D), the monitoring server 126 performs the system actions 130. For example, the monitoring server 126 can perform the actions 130 by sending a command to a device of the monitoring system through a signal to the control unit 116 over the long-range data link. In some implementations, the monitoring server 126 can send a notification 136 and/or alert to the dashboard display 132 in the vehicle 114 or to a mobile device. The monitoring server 126 can communicate with the dashboard display 132 through a cellular telephony or wireless data network, through a WAN or LAN, through Wi-Fi, or through another wired or wireless communication link.

The control unit 116 can activate one or more property automation controls 122, possibly through the network 120. The property automation controls 122 connect to one or more devices of the property 102 and enable control of various property actions. For example, the property automation controls 122 can disable an electric appliance such as the electric stove 104 by powering it off or by opening a breaker. Automation controls can turn on an exhaust vent, open a window, or turn on an air filter, e.g., if the monitoring system determines that the electric stove is on, in order to reduce air contamination such as smoke and fumes. Property automation controls 122 can also reposition one or more surveillance cameras. For example, the property monitoring system may reposition surveillance cameras to scan the rooms of the house to determine if any residents are home. Automation controls can also turn on microphones around the property 102 to listen for sounds that may indicate that residents are home. Automation controls can also be used to adjust a setting on a thermostat, secure a door lock, or control other devices of the property 102.

In the example of FIG. 1, the monitoring server 126 performs the actions 130 by sending the notification 136 to the dashboard display 132 of the resident 118 and by sending an instruction to the control unit 116 to use the automation controls 122 to disable the electric stove 104 by powering it off.

In some implementations, the actions 130 may include sending a message to the dashboard display 132 of the resident 118 and requesting a response from the resident 118. For example, the monitoring server 126 can send a message requesting permission to power off the electric stove 104. The monitoring server 126 can wait until it receives an affirmative response from the resident 118 before adjusting the configuration of the particular automation control 122.

Though described above as being performed by a particular component of system 100 (e.g., the control unit 116 or the monitoring server 126), any of the various control, processing, and analysis operations can be performed by either the control unit 116, the monitoring server 126, or another computer system of the system 100. For example, the control unit 116, the monitoring server 126, or another computer system can analyze the data from the power cables of electrical appliances and sensor data to determine the actions 130. Similarly, the control unit 116, the monitoring server 126, or another computer system can control the various sensors 112, the appliance monitor 106, and/or the property automation controls 122 to collect data or control device operation.

Figure 2C:
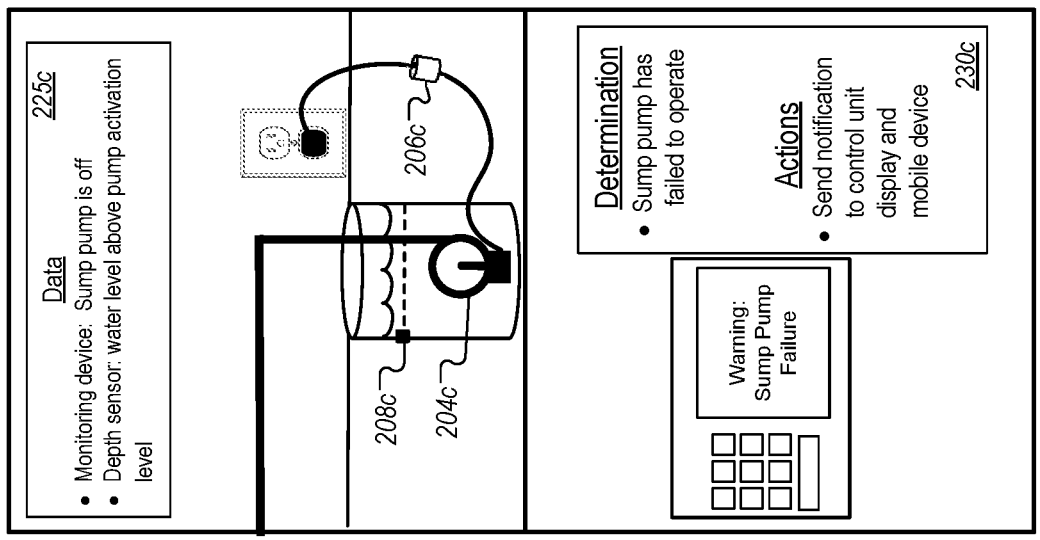
FIGS. 2A, 2B, and 2C are diagrams illustrating examples of property control and configuration based on monitoring the status of electrical appliances.
Figure 2B:
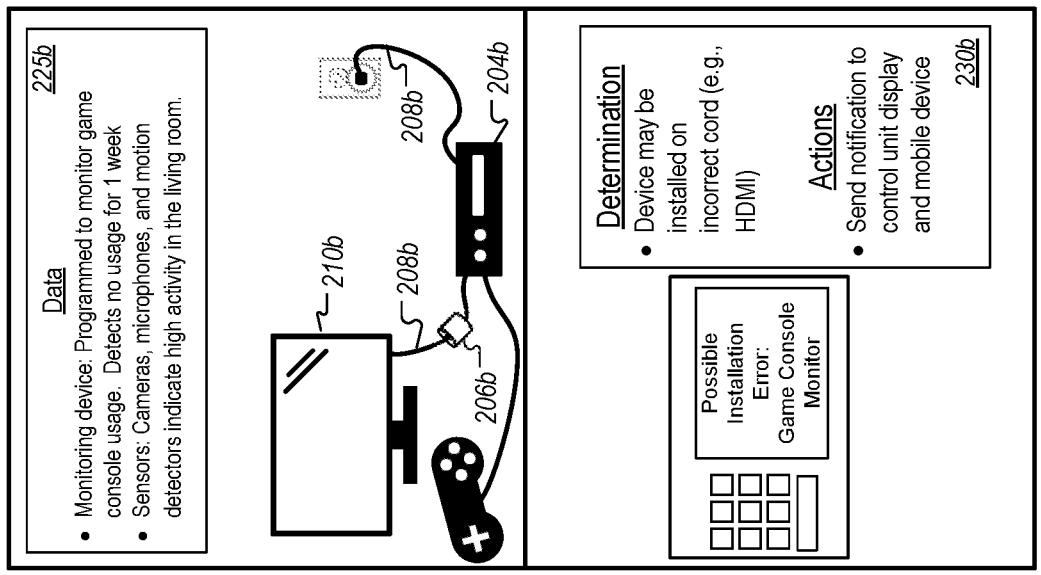
Figure 2A:
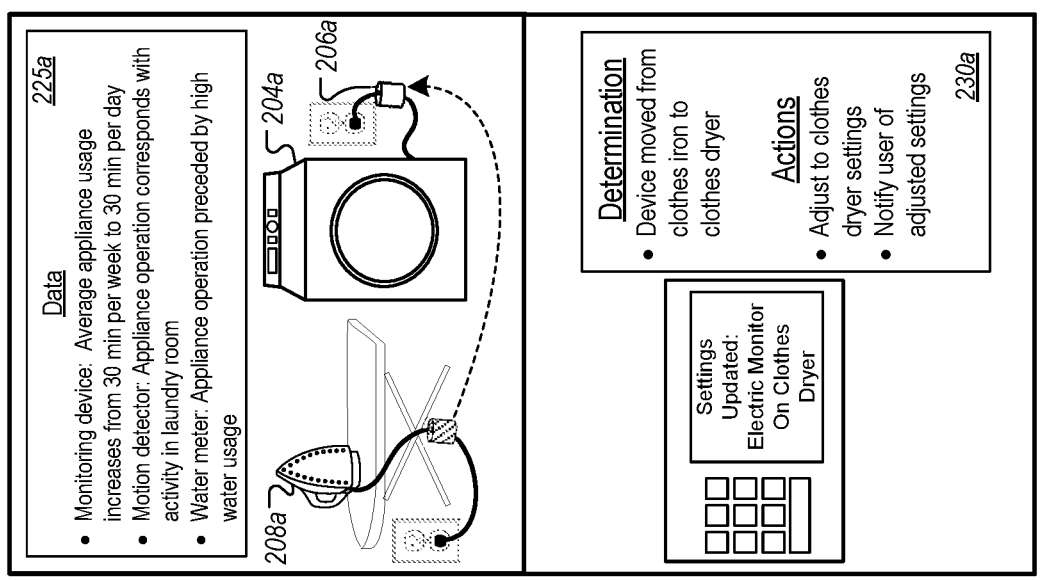

FIGS. 2A, 2B, and 2C are diagrams illustrating examples of property control and configuration based on the status of electrical appliances. FIG. 2A illustrates the system response to an electrical appliance monitor being moved from one appliance to another. In the example in FIG. 2A, a user moved the appliance monitor 206a from the power cable of a clothes iron 208a to the power cable of an electric clothes dryer 204a one week ago. The monitoring system sends data 225a to the monitoring server including data from the appliance monitor 206a and sensor data from sensors connected to the monitoring system.

The appliance monitor 206a sends data reflecting the electricity flowing through the power cable. Over the course of one week, the monitoring server processes the appliance data, including the voltage, current, and time of operation. The monitoring server determines that compared to previous weeks, the average usage of the connected appliance has increased from about 30 minutes per week to 30 minutes per day. The monitoring server also determines that when the appliance is operating, the current and voltage in the power cable are much higher than expected for a clothes iron 208a. Based on the greatly increased usage time, and the increased current and voltage in the power cable, the monitoring server determines that the appliance monitor has likely been moved from the clothes iron to another appliance.

The monitoring server also processes sensor data from the monitoring system. The sensor data includes motion detector data from various areas of the property. By correlating the motion detector data with the data from the appliance monitor 206a, the monitoring server determines that over the course of one week, appliance operation has corresponded with motion activity in the laundry room. Thus, the monitoring server deduces that the appliance monitor has been moved to an appliance in the laundry room.

The sensor data also includes water flow meter data. The monitoring server correlates the water flow meter data with the appliance monitor data. The monitoring server determines that over the course of one week, appliance operation has been preceded by high water usage, occurring approximately one hour prior to appliance operation on average. Since the high water usage occurs before appliance operation, rather than during appliance operation, the monitoring server deduces that the appliance monitor is likely connected to the power cable of the clothes dryer 204a, rather than to the clothes washer.

The monitoring server determines the appropriate system actions 230a based on the settings and preferences established by the resident. The monitoring server can automatically adjust the settings of the appliance monitor 206a to monitor the clothes dryer 204a instead of the clothes iron 208a. For example, according to the user preferences, it may be permissible for a clothes dryer 204a to operate at night while the residents are sleeping, whereas it would not be permissible for a clothes iron 208a to operate at night while the residents are sleeping. The monitoring server can automatically adjust the settings to allow nighttime operation of the connected appliance. The monitoring server can send a notification to the resident's mobile device and/or control unit display that the settings have been adjusted.

FIG. 2B illustrates the system response to an electric appliance monitor being connected to an incorrect cable. In this example, a user attempts to connect the appliance monitor 206b to the power cable of a video game console 204b. However, the user accidentally installs the appliance monitor 206b on the HDMI cable 208b between the video game console 204b and the screen 210b. Due to the low current through the HDMI cable, the appliance monitor cannot detect the current when the system is operating. The resident programs the monitoring system with a rule that the video game console should not operate for more than 2 hours in 1 day. The appliance monitor detects no usage for one week following programming. Based on other monitoring system data, including cameras, microphones, motion detectors, and the monitoring system status, the monitoring server determines that the residents are home. Over the course of a week, motion detectors, microphones, and cameras have specifically detected high amounts of activity in the living room, where the video game console is located. The monitoring server correlates the motion detector data, microphone data, camera data, and appliance monitor data, and deduces that the video game console is likely being used, however the appliance monitor is not detecting its usage.

The monitoring server determines that the appliance monitor 206*b* may have been installed improperly, as it cannot detect any usage of the video game console 204*b*.

When the monitoring server determines that the appliance monitor may have been installed improperly, the monitoring server determines the appropriate system actions 230*b* based on the settings and preferences established by the resident. The monitoring server can send a notification to the resident's mobile device and/or the control unit display that the appliance monitor 206*b* may have been installed improperly.

FIG. 2C illustrates the system response to an electric appliance remaining off when it is expected to turn on. In this example, appliance monitor 206*c* is connected to the power cable of a sump pump 204*c*. The sump pump is located in a sump, or well, in the basement of a property. The sump collects water from the ground surrounding the property to prevent basement flooding. During normal operation, when the water level in the sump reaches a depth sensor 208*c*, the sump pump 204*c* turns on, pumping the water out of the sump. The appliance monitor 206*c* and the depth sensor 208*c* communicate with the monitoring server via the control unit.

In this implementation, the water depth sensor 208*c* measures that the water level has reached the activation level for the sump pump. The appliance monitor 206*c* sends a signal to the monitoring server that the sump pump is off. The monitoring server processes the data 225*c* and determines that the sump pump has failed to start as expected.

The monitoring system determines the appropriate system actions 230*a*. The monitoring server sends an alert to the resident's mobile device and/or to the control unit display to indicate that the sump pump has failed to operate. This prompts the resident to take action to prevent the water from overflowing from the sump into the basement by restoring power to the sump pump or manually removing the water from the sump.

Figure 3A:
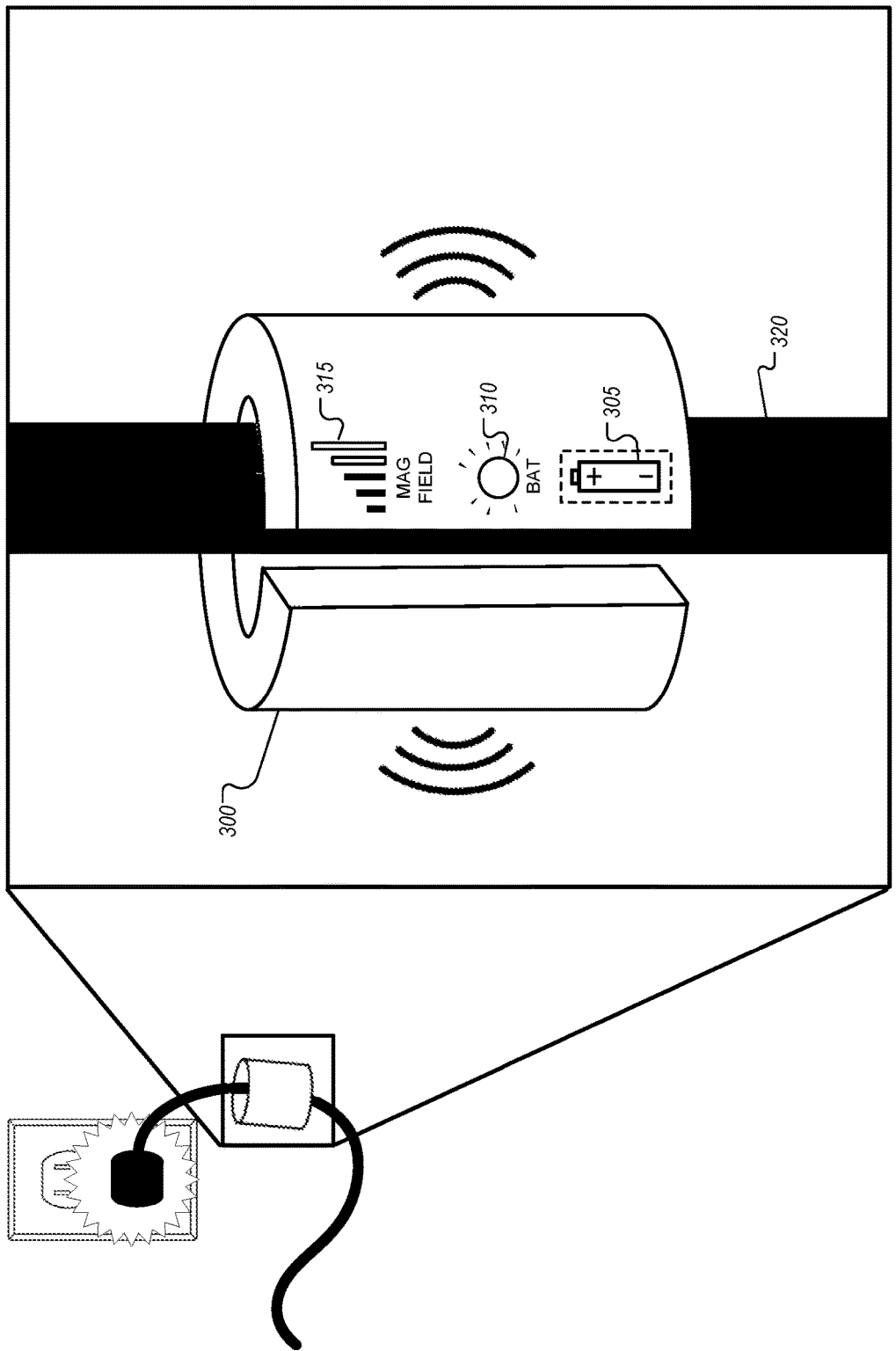
FIGS. 3A, 3B, and 3C are diagrams of example electrical appliance monitor systems.

FIG. 3A is an illustration of one embodiment of the electric appliance monitor. The appliance monitor 300 clips on to the outside of an electric power cable 320. The appliance monitor 300 uses one or more magnetic field sensors to detect current flowing through the cable 320. A magnetic field sensor can be, for example, a Hall Effect sensor, magneto-resistive sensor, induction coil sensor, or any other device that produces an output proportional to the sensed magnetic field strength.

One example of a magnetic field sensor that can be used in the appliance monitor 300 is a Hall Effect sensor. A Hall Effect sensor includes a current-carrying conductor. In the presence of a magnetic field, the current deflects to one edge of the conductor. The deflection of the current causes a voltage difference to develop across the conductor. The Hall Effect sensor measures this voltage difference. The magnitude of the measured voltage difference is proportional to the strength of the magnetic field.

Another example of a magnetic field sensor that can be used in the appliance monitor 300 is a magneto-resistive sensor. A magneto-resistive sensor includes a material that changes resistance when subjected to a magnetic field. The change in material resistance causes a change in current through the material. The magneto-resistive sensor measures the change in current. The change in current is proportional to the strength of the magnetic field.

In the example in FIG. 3, current traveling in a power cable 320 to an appliance produces a magnetic field around the cable. The strength of this magnetic field is proportional to the power consumed by the appliance. The appliance monitor 300 containing a magnetic field sensor is clipped on the outside of the cable, and measures the strength of this magnetic field. When the magnetic field measured by the magnetic field sensor reaches a threshold strength, the appliance monitor 300 determines that the appliance is on.

In addition to the magnetic field sensor, the appliance monitor 300 can also include a non-contact voltage sensor, such as a capacitive voltage sensor. A capacitive voltage sensor includes multiple, capacitive coupling elements. These capacitive coupling elements can enable the appliance monitor 300 to measure the voltage of a power cable 320 without connecting directly to the conductors in the power cable 320.

An appliance power cable 320 typically contains two conductors, one with current traveling to the appliance, and one with current traveling from the appliance to complete the circuit. Thus, an appliance power cable 320 typically has current traveling through parallel conductors in opposite directions. The opposing currents create magnetic fields that cancel one another out at certain positions around the cable. However, a magnetic field sensor placed on the surface of a cable 320 is nearer to one conductor than to the other, so the fields generated by current in opposite directions do not entirely cancel. Therefore, an appliance monitor 300 placed on a power cable 320 can provide flexible positioning on the power cable 320. This flexibility allows the resident to clip the appliance monitor 300 to the power cable 320 in a preferred position, based on the strength of the magnetic field.

Depending on geometry of the conductors within the power cable 320, strong magnetic field may occur at different locations over both its length and circumference. Since there are positions where the magnetic fields from parallel conductors cancel one another out, an interactive method can be used to optimize installation. In one implementation, the resident can turn on the appliance, then attach the appliance monitor 300 to the power cable 320. The appliance monitor 300 can measure and indicate the magnetic field strength at various positions. For example, while the resident moves the appliance monitor 300, the appliance monitor 300 may flash an LED light to indicate a strong magnetic field. In the example in FIG. 3, the appliance monitor includes a strength indicator 315 to provide an indication to the resident when a strong magnetic field is located.

The strength indicator 315 or flashing LED light may be used in conjunction with an application on a mobile device. A resident can provide input to the application indicating when an appliance is on and off. The application can then adjust the threshold magnetic field strength of the appliance monitor to accurately determine the status of the appliance.

The appliance monitor 300 communicates the data from the power cable of the electrical appliance to the control unit through the network. Communication from the appliance monitor 300 can be conducted through various communication links such as a wireless data network, WAN or LAN, through Wi-Fi, or through another wired or wireless communication link.

The appliance monitor 300 can be powered by batteries 305. The appliance monitor 300 does not need to be plugged in to a power outlet. The battery power may be indicated by a battery indicator 310. The battery indicator 310 can be, for example, an LED light that illuminates to indicate battery power. For example, the battery indicator may illuminate green when battery power is high, yellow when battery power is medium, and red when battery power is low.

The appliance monitor 300 can be easily installed by a resident. To aid in installation, the appliance monitor 300 can have one or more features that ensure proper placement on the cable 320. For example, the appliance monitor 300 can use a signal to inform the user when the sensor is optimally positioned. The signal may be an LED, audio signal, or other signal to tell the user when the sensor is optimally positioned. In one example, an LED could be illuminated red and then turn green when it detects a strong field.

In another example, a resident can install several appliance monitors 300 on the cable 320 of one appliance. The resident can monitor the strength of the field detected by each appliance monitor 300 using either indications such as LEDs, or information provided to an app. The resident can compare the field strengths measured by all appliance monitors 300 to determine a preferred or optimal location for installation.

Another method of ensuring optimal placement is to use a band of hall sensors around the conduit, bundled conductors or power cable 320. Each hall sensor can be on a switchable channel. The appliance monitor 300 can scan through all possible combinations for two channels and pick optimal channels. The appliance monitor 300 can periodically repeat the scan to determine if the sensors have been moved.

The appliance monitor can be calibrated for consumption. To perform the calibration, the appliance monitor can use 3 known loads: one 240 VAC load, one 120 VAC load on a first, and one 120 VAC load on a second side. The resident can switch each load on/off and measure the response on each hall channel. The results can be used to generate a gain matrix that accounts for crosstalk and neutral current.

Figure 3B:
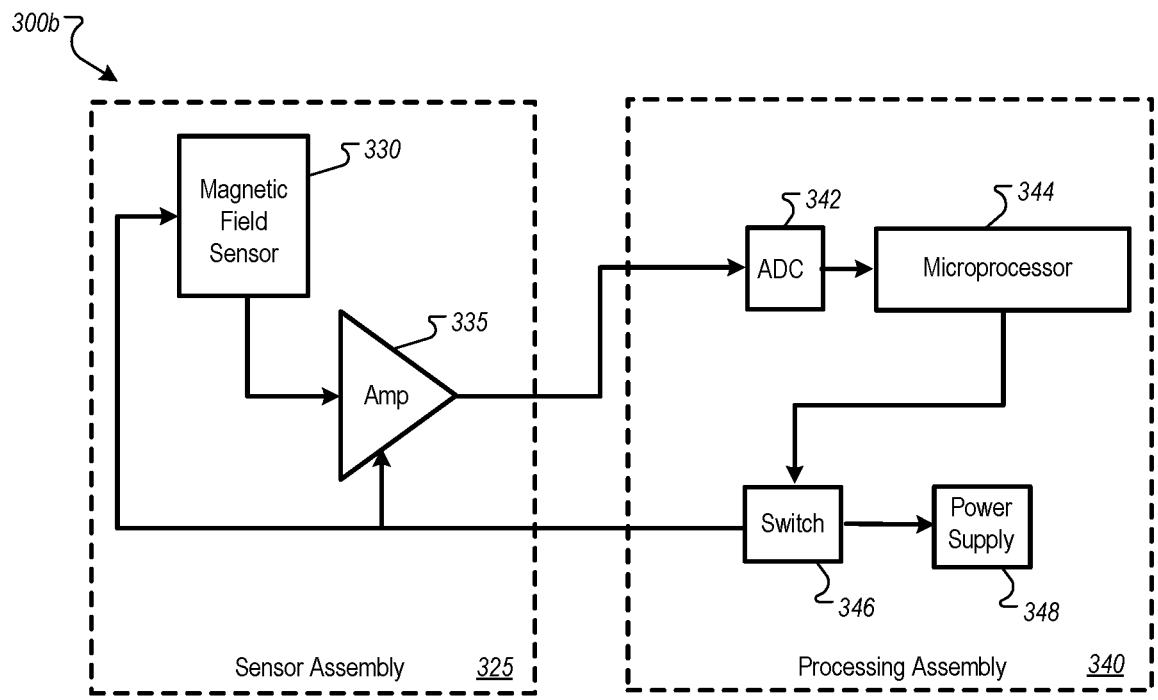
Figure 3C:
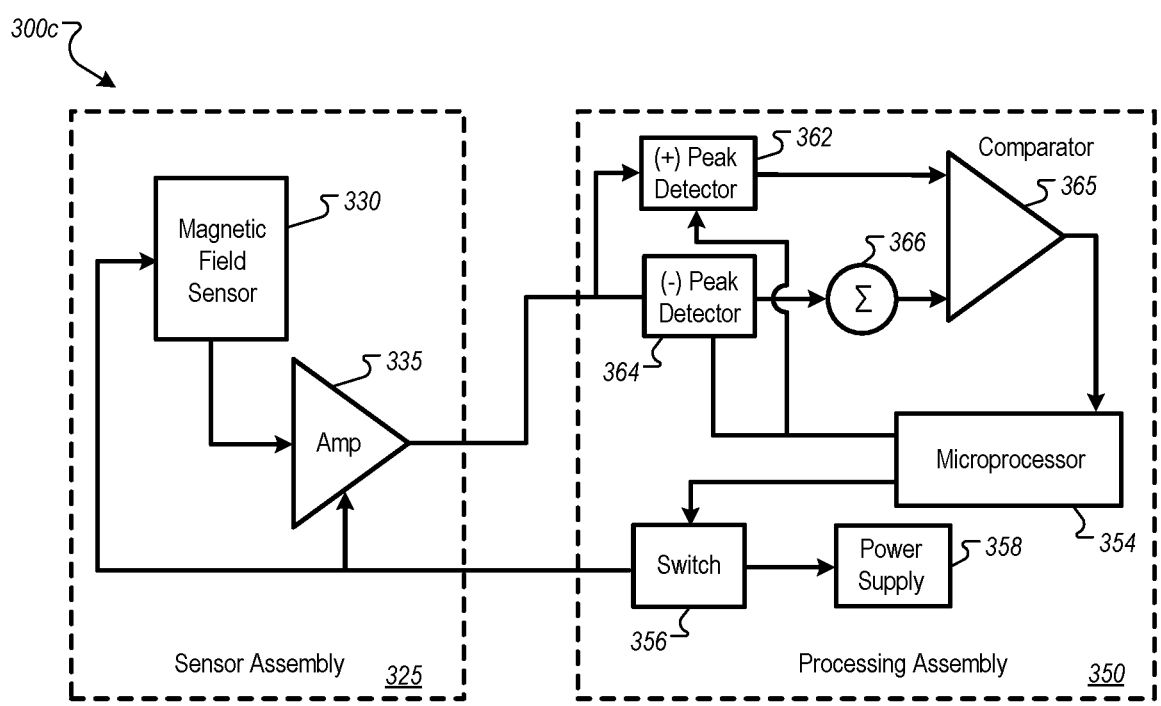

FIGS. 3B and 3C each show a schematic diagram of an example electrical appliance monitor system that includes a sensor assembly and a processing assembly. In general, in FIGS. 3B, and 3C, sampled values for multiple current measurements are converted by the processing assembly to a magnitude value, and compared with a threshold. The results of several comparisons can be used to determine the appliance on/off state. When the appliance is in the off state, any new measurement that exceeds threshold can cause the state to switch to on. When the appliance is in the on state, a number of consecutive measurements below threshold can return the state to off. As state changes are determined, the processing assembly can report the state change, e.g., via a wireless interface to a server, either directly or via a control panel.

In some examples, an appliance may have states other than on and off. For example, when an electric stove is not drawing power for heat generation, the electric stove may draw power for one or more accessories, e.g., for a clock display, lights, etc. When the electric stove is drawing power for a stove top, the electric stove may cycle a stove top heating element on and off in order to maintain a temperature of the stove top. Similarly, when the electric stove is drawing power for an oven, the electric stove may cycle a heating element to maintain a temperature of the oven. Therefore, the electric stove may have multiple power states: an unplugged status, an "off" status for powering only accessories, and multiple "on" statuses for powering the stove top, the oven, or both.

FIG. 3B shows an example electrical appliance monitor system 300b that includes an analog to digital converter (ADC). In general, in FIG. 3B, a sensor assembly 325 monitors current to the appliance. Current can be measured periodically, and time between measurements is variable. Multiple measurements can account for the magnitude of the current sometimes being low even while the electric stove is on, due to cycling. Magnitude of the current for each measurement can be compared to a threshold. Based on an output indicating whether the current magnitude is above or below the threshold over multiple measurements, a processing assembly 340 can determine the appliance on/off state.

In greater detail, FIG. 3B shows the sensor assembly 325 in electrical communication with the processing assembly 340. In some examples, the processing assembly 340 can be incorporated into the same structure or housing as the appliance monitor 300. For example, the processing assembly can be incorporated into the clip-on device shown in FIG. 3A. In some examples, the processing assembly 340 can be incorporated into a separate device from the appliance monitor 300. For example, the processing assembly 340 can be included in a separate clip-on device, can connect to a circuit breaker controlling the branch circuit for the appliance, or can be incorporated into a control unit, e.g., the control unit 116.

The sensor assembly 325 includes a magnetic field sensor 330, as described above, and an amplifier 335. The magnetic field sensor 330 can output an alternating current (AC) voltage that is proportional to the AC current provided to the appliance. The amplifier 335 can increase the AC voltage and provide a low output impedance interface to the processing assembly 340. The amplifier 335 can provide the output to an ADC 342 of the processing assembly 340.

In some examples, the sensor assembly can be powered by a power supply 348 of the processing assembly 340. The processing assembly 340 can include a switch 346 connected to the power supply 348. The switch 346 can control the power supplied to the sensor assembly 325. For example, the processing assembly 340 can activate the switch 346 to supply power from a power supply 348 to the sensor assembly 325 for each current measurement. The processing assembly 340 can sample the output from the sensor assembly 325, and then activate the switch 346 to remove power to the sensor assembly 325.

For example, the processing assembly 340 can switch the sensor assembly 325 on by providing power from the power supply 348 to the magnetic field sensor 330 and the amplifier 335. The ADC 342 can then sample the output of the sensor assembly 325 for a period of time, e.g., 15 milliseconds (ms), 17 ms, or 20 ms. The sample rate can be, for example, 1000 samples per second (sps), 1200 sps, or 1500 sps. With a sample rate of 1200 sps, for a total of 20 samples, measured current magnitude can be determined with an error of less than two percent. In some examples, the ADC 342 can include filtering in order to reduce effects of noise spikes.

A microprocessor 344 can convert the samples for each measurement into a current magnitude value based on peak-to-peak levels. In some examples, a three-sample moving average filter can be applied to the samples. The microprocessor 344 can then determine peak-to-peak level by taking a ratio of the maximum to minimum moving average values.

When an appliance state is determined to be off, measurements can be taken infrequently, e.g., once per minute, plus a random time offset. The random time offset can have a distribution, e.g., a uniform statistical distribution from −30 seconds to +30 seconds. The random time offset can be applied to prevent aliasing in cases where the appliance is rapidly switching current on/off to maintain temperature. Once the ADC 342 samples the output of the amplifier 335 and converts the output to a digital measurement, the microprocessor 344 can compare the current measurement to a threshold. If the current measurement exceeds the threshold, the microprocessor 344 can determine that the appliance state is on.

When the appliance state is determined to be on, measurements can be taken more frequently, e.g., once every 20 seconds, plus a random time offset. The random time offset can have a distribution, e.g., a uniform statistical distribution from −10 seconds to +10 seconds. The faster sampling rate with the appliance state on can reduce the likelihood of missing a time period during which the current is above the threshold. The faster sampling rate can reduce the minimum time required return to the off state, once the appliance is turned off.

When the determined appliance state switches from off to on, a counter of the microprocessor 344 is set to zero. Once each subsequent current measurement is sampled, the current measurement is compared to a threshold. If the current measurement is below threshold, then the counter is incremented. If the current measurement is above threshold, then the counter is reset to zero. If the counter reaches a preset counter value, the microprocessor 344 can determine that the appliance has switched from on to off. For example, the preset counter value may be a counter value that corresponds to ten minutes at a nominal measurement rate.

FIG. 3C shows an example electrical appliance monitor system 300c that includes positive peak detectors 362, negative peak detector 364, and a comparator 365, instead of the ADC 342. The peak detectors 362, 364 can be precharged to respective rails during an analog stabilization time, each using a transistor controlled by microprocessor 354. After the stabilization time, the charging transistors can be switched off, and each peak detector 362, 364 can be charged or discharged via a series diode. An offset 366 can be added to the negative peak detector 364. The offset 366 can be a fixed offset or a programmable offset. The peak detectors 362, 364 can establish a threshold that must be overcome to switch the comparator 365. The output of the comparator 365 can be provided to the microprocessor 354 at the end of each measurement period. After the microprocessor 354 receives the output of the comparator 365, the microprocessor can determine the on/off state of the appliance, using a process similar to as described with reference to FIG. 3B.

Figure 4:
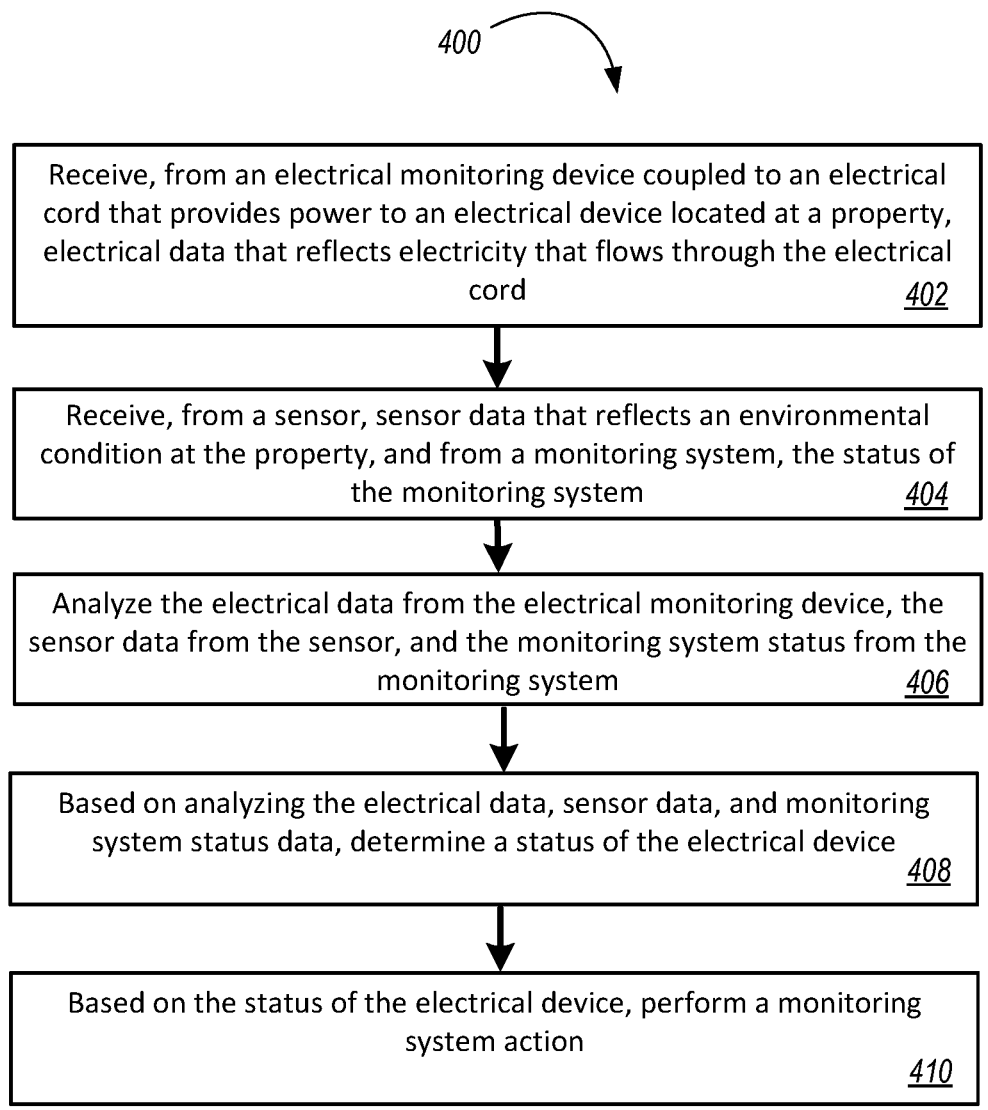
FIG. 4 is a flow chart illustrating an example of a process for property control and configuration based on monitoring the status of electrical appliances.

FIG. 4 is a flow chart illustrating an example of a process for property control and configuration based on the data from the power cables of electrical appliances. Process 400 can be performed by one or more computer systems, for example, the monitoring server 126 of system 100. In some implementations, some or all of the process can be performed by the control unit 116 of the system 100, or by another computer system located at the monitored property.

Briefly, process 400 receives data from an electrical monitoring device regarding the electricity flowing to an electrical appliance. Process 400 also receives sensor data from other sensors connected to a property monitoring system. Process 400 includes analyzing the data to determine the status of the electrical appliance and performing a monitoring action in response to the status of the appliance.

In more detail, the monitoring server, control unit, or another computer system receives, from an electrical monitoring device coupled to an electrical cord that provides power to an electrical device located at a property, electrical data that reflects electricity that flows through the electrical cord (402). In some implementations, the electrical data includes a binary on or off status of the electrical device. In some implementations, the electrical data includes a time duration that the electrical device has been powered on. The electrical data can also include a time-varying measured current of the electrical cord, a time-varying measured voltage of the electrical cord, or both.

In some implementations, the electrical monitoring device is removably coupled to an exterior of the electrical cord. The electrical monitoring device can be clipped to an exterior of an electrical cord that provides power to an electrical device located at the property. For example, an electrical monitoring device such as the appliance monitor 106 can be clipped to the power cable 110 of the electric stove 104 at the property 102. The appliance monitor 106 can output electrical data that reflects that the electric stove 104 is on.

In some implementations, the monitoring server is remote from the property and a control unit located at the property sends the electrical data to the monitoring server over a long-range data link. In some implementations, the server receives electrical data for more than one appliance at the property.

The server or other computer system receives, from a sensor, sensor data that reflects an environmental condition at the property, and from a monitoring system, the status of the monitoring system (404). For example, the server may receive motion detector data from areas around the property, indicating the locations of residents. Sensor data can also include temperature data from various rooms of the property, and water flow meter data regarding the flow of water to and from sinks, showers, and toilets on the property. Sensor data can include data from sensors such as humidity sensors, light detectors, sump water level sensors, and vehicle location trackers. The server may also receive the monitoring system status such as "armed, away" or "unarmed, home."

The server analyzes the electrical data from the electrical monitoring device, the sensor data from the sensor, and the monitoring system status from the monitoring system (406). The server can analyze the electrical data to determine if there has recently been a change in the status of an electrical appliance, such as if it was recently on and then powered off. Additionally, the server can determine the length of time an electrical appliance has been operating continuously, or the total amount of time an electrical appliance has operated over the course of a certain timeframe such as a day or a week.

In some implementations, the monitoring server can determine that a time duration that the electrical device has been powered on exceeds a threshold time duration. For example, the electrical data for the video game console 204b can include that the video game console 204b has been powered on for more than two hours during a single day. The threshold time duration for the video game console 204b, e.g., as programmed by the resident, may be two hours per day. The monitoring server can determine that the time duration that the video game console 204b has been powered on exceeds the threshold time duration. Based on determining that the time duration that the video game console 204b has been powered on exceeds the threshold time duration, the monitoring server can perform a monitoring system action, e.g., by removing power to the video game console 204b, by providing a notification to the resident, or both.

The server can also determine if the measured current or voltage in a power cord is higher or lower than expected during operation. During installation, an appliance monitor is calibrated for the appliance to which it is connected. The calibration sets a baseline for the expected voltage and current drawn from the connected appliance. After calibration, if the voltage or current of the appliance is higher or lower than the established baseline, the server can determine that there is an anomaly and use this information to determine a system response.

There may be various levels of current and voltage for appliance that have multiple settings. For example, an electric clothes dryer set to a high temperature will have a greater electric current flow than when set to a low temperature. The appliance monitor is calibrated for various modes of operation of the appliance.

Certain appliances in a residence may use lower voltages than other appliances. Low voltage appliances, such as coffee makers and clothes irons, may use voltages such as 120 V. Other appliances, such as electric clothes dryers and electric stoves, may use higher voltages such as 240 V. If an appliance monitor is set to monitor a coffee maker, but then detects a voltage of 240V, the monitoring server can determine that the measured voltage is higher than expected. This may indicate that the appliance monitor has been connected to the wrong cable, or that the appliance monitor has been moved to from the coffee maker to another appliance that uses more voltage.

The server also analyzes sensor data. The server can analyze motion detectors to determine if residents are at home, and to determine which rooms the residents are occupying. The server can analyze water flow meter data to determine if any water-consuming appliances are in use. The server can also analyze sump pump water level data to determine if the water level is above the activation level of the sump pump. Additionally, the server analyzes the system status, such as a status of "armed, away," indicating that the resident is likely not at home.

Based on analyzing the electrical data, sensor data, and monitoring system status data, the server determines a status of an electrical device (408). In some implementations, the sensor is a motion detector that is configured to generate motion data. The monitoring server is configured to receive the motion data, and to determine an occupancy of the property based on the motion data. For example, the sensors 112 may include a motion detector. The motion detector may detect no motion during a period of time, e.g., a certain number of minutes or hours. Based on analyzing the motion data, the monitoring server 126 may determine that the property 102 is unoccupied. Based on the electrical data, the monitoring server 126 may determine that the electric stove 104 is on at the time the property 102 is unoccupied.

In some implementations, the monitoring server can determine, over a period of time, a trend of electrical data. The monitoring server can detect a deviation from the trend of electrical data based on analyzing the sensor data and the electrical data. In response to detecting the deviation from the trend of electrical data, the monitoring server can perform the monitoring system action.

For example, the monitoring server can determine a trend of electrical data for the clothes iron 208a. The trend may include that the clothes iron 208a is powered on for an average of thirty minutes per week. The monitoring server may then determine that over the course of one week, the clothes iron 208a is powered on for an average of thirty minutes per day. The monitoring server can detect the deviation from the trend of electrical data. In response to detecting the deviation, the monitoring server can perform an action. For example, the monitoring server can communicate a notification to a resident of the property regarding the deviation.

In some implementations, based on the sensor data and the status of the monitoring system, the monitoring server can determine an expected status of the electrical device. The monitoring server may determine that the status of the electrical device deviates from the expected status of the electrical device. In response to determining that status of the electrical device deviates from the expected status of the electrical device, the monitoring server can perform the monitoring system action.

For example, the sensor may be a vehicle tracker that uses GPS to locate a vehicle 114 of the resident 118. The sensor data may indicate that the vehicle 114 is near the property 102 and traveling away from the property 102. The monitoring system status may be "armed, away." Based on analyzing the sensor data and the monitoring system status, the monitoring server 126 can determine that the resident 118 is departing from the property 102, and that the expected status of the electric stove 104 is off. Based on analyzing the electrical data, the monitoring server may determine that the electric stove 104 is on. Based on the status of the electric stove 104 being on, and the expected status of the electric stove 104 being off, the monitoring server 126 can determine that the status of the electric stove 104 deviates from the expected status of the electric stove 104. In response to determining that the status of the electric stove 104 deviates from the expected status of the electric stove 104, the monitoring server 126 can perform a monitoring system action 130. For example, the monitoring server 126 can communicate a notification 136 to the resident 118, can power off the electric stove 104, or both.

In another example, the sensor may be a water level sensor in a sump of the property. The monitoring server may determine, based on the sensor data and the electrical data, that the sump water level is above the sump pump activation level, and that the sump pump is not operating. The server can use this information to determine that the sump pump has lost power, and the property is in danger of flooding.

Based on the status of the electrical device, the monitoring server performs a monitoring system action (410). In some implementations, the status of the electrical device is on, and the monitoring system action includes removing power to the electrical device. For example, the status of the electric stove 104 may be on, and the monitoring server 126 can perform actions 130 including removing power to the electric stove 104. Removing power to the electric stove 104 can include, for example, using automatic controls to open a circuit breaker powering the electric stove 104, to switch the electric stove 104 off, or both.

In some implementations, the status of the electrical device is off, and the monitoring system action includes providing power to the electrical device. For example, the status of the sump pump 204c may be off, and the monitoring server can perform actions including providing power to the sump pump 204c. Providing power to the sump pump 204c can include, for example, using automatic controls to shut a circuit breaker powering the sump pump 204c, to activate a backup power supply for the sump pump 204c, or both.

In some implementations, the monitoring system action includes providing a notification reflecting the status of the electrical device. For example, the monitoring server 126 can provide the notification 136 to the resident 118 via the dashboard display 132 of the vehicle 114 reflecting that the electric stove 104 is on.

The server can determine the one or more actions based on one or more rules accessed by the server. For example, the server can send an instruction to an appliance on the property to perform an action, such as disabling or enabling the device, adjusting a setting of the device, or triggering an operation of the device. The server can activate or change the operating mode of a sensor of the property, or sound an alarm of the property.

The server can also send a message to a mobile device of a user or resident, for example, a text message, an e-mail message, a push notification, a message through a software application, or another alert. In some implementations, the server may send a message to the mobile device of a user requesting permission to perform another action of the monitoring system. For example, the server may request permission to deactivate an electrical outlet. In some cases, the server may send a message to a third-party, such as security or emergency-services personnel.

This device could be valuable not only to users, but to homeowners' insurers. Typically, users and insurers rely upon carbon monoxide (CO) and smoke detectors to detect fires in homes. If an electric stove, or similar electrical device, is left on too long, CO and smoke detectors can only help once the problem has escalated so that enough smoke has been generated to trigger the device. By the time a smoke detector is set off, chances are that a fire has already begun or is imminent.

The electrical appliance monitor could be used to eliminate potential fires before they escalate. This would be of value to homeowners' insurers because fires contribute a large percentage of claim-related losses. Fire-related claims create unmatched claims in terms of payouts. Fire-related claims also include a significant percentage of overall liability losses for residential insurers.

Insurers are actively seeking ways to reduce the size of residential claims through the installation of connected devices. For example, insurers recently started to subsidize devices that detect water leaks to reduce the large cost of claims associated with water damage. Likewise, insurers would be interested in a device that would reduce fire-related claims in residential homes, and could potentially subsidize these devices to provide incentive to their customers to install the device.

Figure 5:
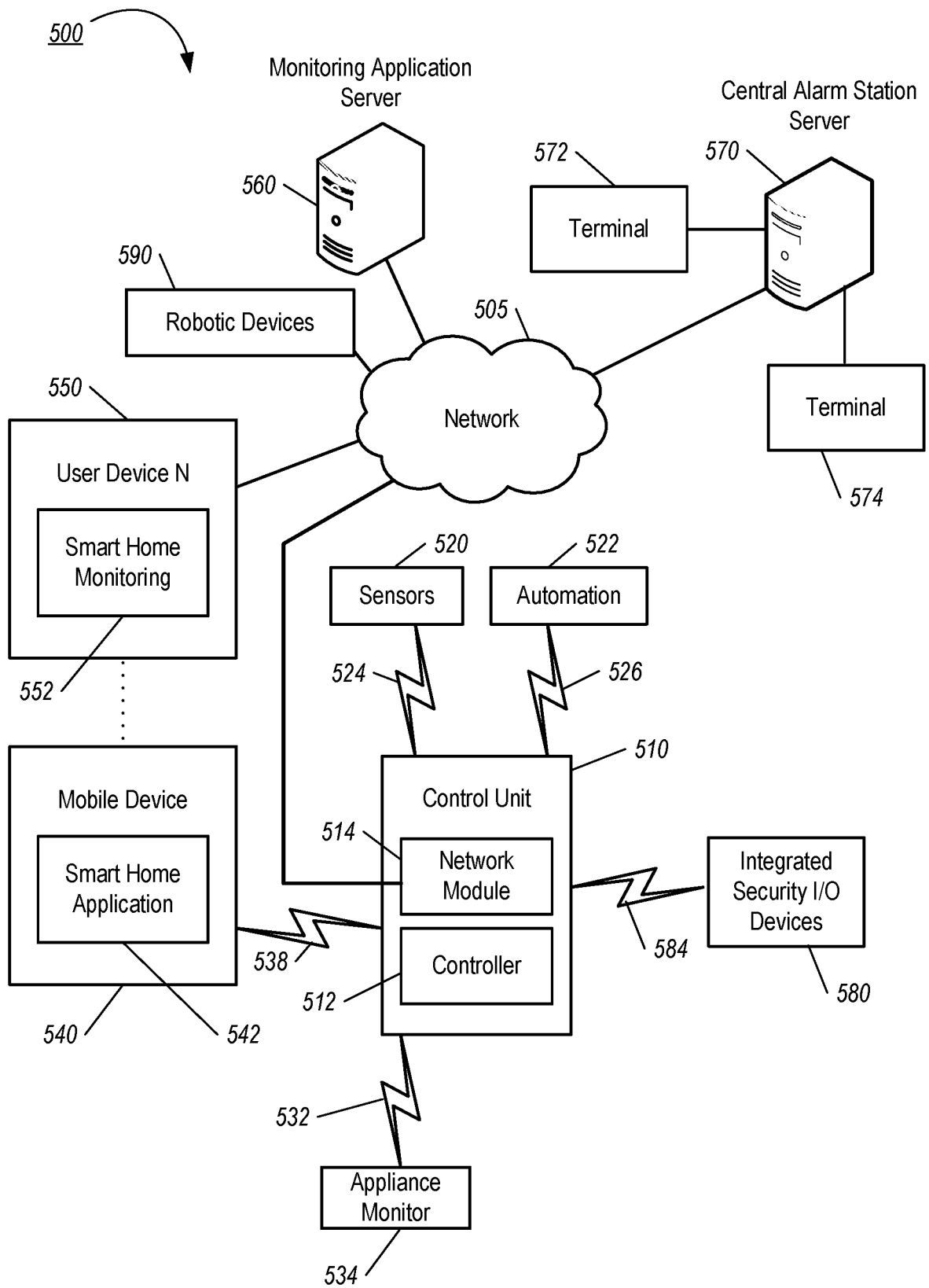
FIG. 5 is a diagram illustrating an example of a property monitoring system.

FIG. 5 is a diagram illustrating an example of a property monitoring system 500. The system 500 includes a network 505, a control unit 510, one or more user devices 540 and 550, a monitoring server 560, and a central alarm station server 570. In some examples, the network 505 facilitates communications between the control unit 510, the one or more user devices 540 and 550, the monitoring server 560, and the central alarm station server 570.

An electrical appliance monitor 534 connects to the network 505 through the control unit 510. The electrical appliance monitor 534 measures electrical data that reflects electricity that flows through the power cable of an electrical appliance. The electrical appliance monitor 534 sends the electrical data to the control unit 510. The network 505 is configured to enable exchange of electronic communications between devices connected to the network 505. For example, the network 505 may be configured to enable exchange of electronic communications between the control unit 510, the one or more user devices 540 and 550, the monitoring server 560, and the central alarm station server 570. The network 505 may include, for example, one or more of the Internet, Wide Area Networks (WANs), Local Area Networks (LANs), analog or digital wired and wireless telephone networks (e.g., a public switched telephone network (PSTN), Integrated Services Digital Network (ISDN), a cellular network, and Digital Subscriber Line (DSL)), radio, television, cable, satellite, or any other delivery or tunneling mechanism for carrying data. The network 505 may include multiple networks or subnetworks, each of which may include, for example, a wired or wireless data pathway. The network 505 may include a circuit-switched network, a packet-switched data network, or any other network able to carry electronic communications (e.g., data or voice communications). For example, the network 505 may include networks based on the Internet protocol (IP), asynchronous transfer mode (ATM), the PSTN, packet-switched networks based on IP, X.25, or Frame Relay, or other comparable technologies and may support voice using, for example, VoIP, or other comparable protocols used for voice communications. The network 505 may include one or more networks that include wireless data channels and wireless voice channels. The network 505 may be a wireless network, a broadband network, or a combination of networks including a wireless network and a broadband network.

The control unit 510 includes a controller 512 and a network module 514. The controller 512 is configured to control a control unit monitoring system (e.g., a control unit system) that includes the control unit 510. In some examples, the controller 512 may include a processor or other control circuitry configured to execute instructions of a program that controls operation of a control unit system. In these examples, the controller 512 may be configured to receive input from sensors, appliance monitors, or other devices included in the control unit system and control operations of devices included in the household (e.g., speakers, lights, doors, etc.). For example, the controller 512 may be configured to control operation of the network module 514 included in the control unit 510.

The network module 514 is a communication device configured to exchange communications over the network 505. The network module 514 may be a wireless communication module configured to exchange wireless communications over the network 505. For example, the network module 514 may be a wireless communication device configured to exchange communications over a wireless data channel and a wireless voice channel. In this example, the network module 514 may transmit alarm data over a wireless data channel and establish a two-way voice communication session over a wireless voice channel. The wireless communication device may include one or more of a LTE module, a GSM module, a radio modem, cellular transmission module, or any type of module configured to exchange communications in one of the following formats: LTE, GSM or GPRS, CDMA, EDGE or EGPRS, EV-DO or EVDO, UMTS, or IP.

The network module 514 also may be a wired communication module configured to exchange communications over the network 505 using a wired connection. For instance, the network module 514 may be a modem, a network interface card, or another type of network interface device. The network module 514 may be an Ethernet network card configured to enable the control unit 510 to communicate over a local area network and/or the Internet. The network module 514 also may be a voice band modem configured to enable the alarm panel to communicate over the telephone lines of Plain Old Telephone Systems (POTS).

The control unit system that includes the control unit 510 includes one or more sensors 520. For example, the monitoring system may include multiple sensors 520. The sensors 520 may include a lock sensor, a contact sensor, a motion sensor, or any other type of sensor included in a control unit system. The sensors 520 also may include an environmental sensor, such as a thermometer, a water sensor, a rain sensor, a wind sensor, a light sensor, a smoke detector, a carbon monoxide detector, an air quality sensor, etc.

The system 500 also includes one or more property automation controls 522 that communicate with the control unit 510 to perform monitoring. The property automation controls 522 are connected to one or more devices connected to the system 500 and enable automation of actions at the property. For instance, the property automation controls 522 may be connected to one or more lighting systems and may be configured to control operation of the one or more lighting systems. Also, the property automation controls 522 may be connected to one or more electronic locks at the property and may be configured to control operation of the one or more electronic locks (e.g., control Z-Wave locks using wireless communications in the Z-Wave protocol). Further, the property automation controls 522 may be connected to one or more appliances at the property and may be configured to control operation of the one or more appliances. The property automation controls 522 may include multiple modules that are each specific to the type of device being controlled in an automated manner. The property automation controls 522 may control the one or more devices based on commands received from the control unit 510. For instance, the property automation controls 522 may interrupt power delivery to a particular outlet of the property or induce movement of a smart window shade of the property.

In some examples, the system 500 includes one or more robotic devices 590. The robotic devices 590 may be any type of robot that are capable of moving and taking actions that assist in home monitoring. For example, the robotic devices 590 may include drones that are capable of moving throughout a property based on automated control technology and/or user input control provided by a user. In this example, the drones may be able to fly, roll, walk, or otherwise move about the property. The drones may include helicopter type devices (e.g., quad copters), rolling helicopter type devices (e.g., roller copter devices that can fly and/or roll along the ground, walls, or ceiling) and land vehicle type devices (e.g., automated cars that drive around a property). In some cases, the robotic devices 590 may be robotic devices 590 that are intended for other purposes and merely associated with the system 500 for use in appropriate circumstances. For instance, a robotic aerial drone may be associated with the monitoring system 500 as one of the robotic devices 590 and may be controlled to take action responsive to monitoring system events.

In some examples, the robotic devices 590 automatically navigate within a property. In these examples, the robotic devices 590 include sensors and control processors that guide movement of the robotic devices 590 within the property. For instance, the robotic devices 590 may navigate within the property using one or more cameras, one or more proximity sensors, one or more gyroscopes, one or more accelerometers, one or more magnetometers, a global positioning system (GPS) unit, an altimeter, one or more sonar or laser sensors, and/or any other types of sensors that aid in navigation about a space. The robotic devices 590 may include control processors that process output from the various sensors and control the robotic devices 590 to move along a path that reaches the desired destination and avoids obstacles. In this regard, the control processors detect walls or other obstacles in the property and guide movement of the robotic devices 590 in a manner that avoids the walls and other obstacles.

In addition, the robotic devices 590 may store data that describes attributes of the property. For instance, the robotic devices 590 may store a floorplan of a building on the property and/or a three-dimensional model of the property that enables the robotic devices 590 to navigate the property. During initial configuration, the robotic devices 590 may receive the data describing attributes of the property, determine a frame of reference to the data (e.g., a property or reference location in the property), and navigate the property based on the frame of reference and the data describing attributes of the property. Further, initial configuration of the robotic devices 590 also may include learning of one or more navigation patterns in which a user provides input to control the robotic devices 590 to perform a specific navigation action (e.g., fly to an upstairs bedroom and spin around while capturing video and then return to a home charging base). In this regard, the robotic devices 590 may learn and store the navigation patterns such that the robotic devices 590 may automatically repeat the specific navigation actions upon a later request.

In some examples, the robotic devices 590 may include data capture and recording devices. In these examples, the robotic devices 590 may include one or more cameras, one or more motion sensors, one or more microphones, one or more biometric data collection tools, one or more temperature sensors, one or more humidity sensors, one or more air flow sensors, and/or any other types of sensors that may be useful in capturing monitoring data related to the property and users at the property.

In some implementations, the robotic devices 590 may include output devices. In these implementations, the robotic devices 590 may include one or more displays, one or more speakers, and/or any type of output devices that allow the robotic devices 590 to communicate information to a nearby user.

The robotic devices 590 also may include a communication module that enables the robotic devices 590 to communicate with the control unit 510, each other, and/or other devices. The communication module may be a wireless communication module that allows the robotic devices 590 to communicate wirelessly. For instance, the communication module may be a Wi-Fi module that enables the robotic devices 590 to communicate over a local wireless network at the property. The communication module further may be a 900 MHz wireless communication module that enables the robotic devices 590 to communicate directly with the control unit 510. Other types of short-range wireless communication protocols, such as Bluetooth, Bluetooth LE, Z-wave, Zigbee, etc., may be used to allow the robotic devices 590 to communicate with other devices in the property. In some implementations, the robotic devices 590 may communicate with each other or with other devices of the system 500 through the network 505.

The robotic devices 590 further may include processor and storage capabilities. The robotic devices 590 may include any suitable processing devices that enable the robotic devices 590 to operate applications and perform the actions described throughout this disclosure. In addition, the robotic devices 590 may include solid state electronic storage that enables the robotic devices 590 to store applications, configuration data, collected sensor data, and/or any other type of information available to the robotic devices 590.

The robotic devices 590 can be associated with one or more charging stations. The charging stations may be located at predefined home base or reference locations at the property. The robotic devices 590 may be configured to navigate to the charging stations after completion of tasks needed to be performed for the monitoring system 500. For instance, after completion of a monitoring operation or upon instruction by the control unit 510, the robotic devices 590 may be configured to automatically fly to and land on one of the charging stations. In this regard, the robotic devices 590 may automatically maintain a fully charged battery in a state in which the robotic devices 590 are ready for use by the monitoring system 500.

The charging stations may be contact-based charging stations and/or wireless charging stations. For contact-based charging stations, the robotic devices 590 may have readily accessible points of contact that the robotic devices 590 are capable of positioning and mating with a corresponding contact on the charging station. For instance, a helicopter type robotic device 590 may have an electronic contact on a portion of its landing gear that rests on and mates with an electronic pad of a charging station when the helicopter type robotic device 590 lands on the charging station. The electronic contact on the robotic device 590 may include a cover that opens to expose the electronic contact when the robotic device 590 is charging and closes to cover and insulate the electronic contact when the robotic device is in operation.

For wireless charging stations, the robotic devices 590 may charge through a wireless exchange of power. In these cases, the robotic devices 590 need only locate themselves closely enough to the wireless charging stations for the wireless exchange of power to occur. In this regard, the positioning needed to land at a predefined home base or reference location in the property may be less precise than with a contact based charging station. Based on the robotic devices 590 landing at a wireless charging station, the wireless charging station outputs a wireless signal that the robotic devices 590 receive and convert to a power signal that charges a battery maintained on the robotic devices 590.

In some implementations, each of the robotic devices 590 has a corresponding and assigned charging station such that the number of robotic devices 590 equals the number of charging stations. In these implementations, the robotic devices 590 always navigate to the specific charging station assigned to that robotic device. For instance, a first robotic device 590 may always use a first charging station and a second robotic device 590 may always use a second charging station.

In some examples, the robotic devices 590 may share charging stations. For instance, the robotic devices 590 may use one or more community charging stations that are capable of charging multiple robotic devices 590. The community charging station may be configured to charge multiple robotic devices 590 in parallel. The community charging station may be configured to charge multiple robotic devices 590 in serial such that the multiple robotic devices 590 take turns charging and, when fully charged, return to a predefined home base or reference location in the property that is not associated with a charger. The number of community charging stations may be less than the number of robotic devices 590.

Also, the charging stations may not be assigned to specific robotic devices 590 and may be capable of charging any of the robotic devices 590. In this regard, the robotic devices 590 may use any suitable, unoccupied charging station when not in use. For instance, when one of the robotic devices 590 has completed an operation or is in need of battery charge, the control unit 510 references a stored table of the occupancy status of each charging station and instructs the robotic device 590 to navigate to the nearest charging station that is unoccupied.

The system 500 further includes one or more integrated security devices 580. The one or more integrated security devices may include any type of device used to provide alerts based on received sensor data. For instance, the one or more control units 510 may provide one or more alerts to the one or more integrated security input/output devices 580. Additionally, the one or more control units 510 may receive one or more sensor data from the sensors 520 and determine whether to provide an alert to the one or more integrated security input/output devices 580.

The sensors 520, the property automation controls 522, and the integrated security devices 580 may communicate with the controller 512 over communication links 524, 526, 532, and 584. The communication links 524, 526, 532, and 584 may be a wired or wireless data pathway configured to transmit signals from the sensors 520, the property automation controls 522, the appliance monitor 534, and the integrated security devices 580 to the controller 512. The sensors 520, the property automation controls 522, the appliance monitor 534, and the integrated security devices 580 may continuously transmit sensed values to the controller 512, periodically transmit sensed values to the controller 512, or transmit sensed values to the controller 512 in response to a change in a sensed value.

The communication links 524, 526, 532, and 584 may include a local network. The sensors 520, the property automation controls 522, the appliance monitor 534, and the integrated security devices 580, and the controller 512 may exchange data and commands over the local network. The local network may include 802.11 "Wi-Fi" wireless Ethernet (e.g., using low-power Wi-Fi chipsets), Z-Wave, Zigbee, Bluetooth, "Homeplug" or other "Powerline" networks that operate over AC wiring, and a Category 5 (CAT5) or Category 6 (CAT6) wired Ethernet network. The local network may be a mesh network constructed based on the devices connected to the mesh network.

The monitoring server 560 is one or more electronic devices configured to provide monitoring services by exchanging electronic communications with the control unit 510, the one or more user devices 540 and 550, and the central alarm station server 570 over the network 505. For example, the monitoring server 560 may be configured to monitor events (e.g., alarm events) generated by the control unit 510. In this example, the monitoring server 560 may exchange electronic communications with the network module 514 included in the control unit 510 to receive information regarding events (e.g., alerts) detected by the control unit 510. The monitoring server 560 also may receive information regarding events (e.g., alerts) from the one or more user devices 540 and 550.

In some examples, the monitoring server 560 may route alert data received from the network module 514 or the one or more user devices 540 and 550 to the central alarm station server 570. For example, the monitoring server 560 may transmit the alert data to the central alarm station server 570 over the network 505.

The monitoring server 560 may store sensor data and other monitoring system data received from the monitoring system and perform analysis of the sensor data and other monitoring system data received from the monitoring system. Based on the analysis, the monitoring server 560 may communicate with and control aspects of the control unit 510 or the one or more user devices 540 and 550.

The monitoring server 560 may provide various monitoring services to the system 500. For example, the monitoring server 560 may analyze the sensor and other data to determine an activity pattern of a resident of the property monitored by the system 500. In some implementations, the monitoring server 560 may analyze the data for alarm conditions or may determine and perform actions at the property by issuing commands to one or more of the automation controls 522, possibly through the control unit 510.

The central alarm station server 570 is an electronic device configured to provide alarm monitoring service by exchanging communications with the control unit 510, the one or more mobile devices 540 and 550, and the monitoring server 560 over the network 505. For example, the central alarm station server 570 may be configured to monitor alerting events generated by the control unit 510. In this example, the central alarm station server 570 may exchange communications with the network module 514 included in the control unit 510 to receive information regarding alerting events detected by the control unit 510. The central alarm station server 570 also may receive information regarding alerting events from the one or more mobile devices 540 and 550 and/or the monitoring server 560.

The central alarm station server 570 is connected to multiple terminals 572 and 574. The terminals 572 and 574 may be used by operators to process alerting events. For example, the central alarm station server 570 may route alerting data to the terminals 572 and 574 to enable an operator to process the alerting data. The terminals 572 and 574 may include general-purpose computers (e.g., desktop personal computers, workstations, or laptop computers) that are configured to receive alerting data from a server in the central alarm station server 570 and render a display of information based on the alerting data. For instance, the controller 512 may control the network module 514 to transmit, to the central alarm station server 570, alerting data indicating that a sensor 520 detected motion from a motion sensor via the sensors 520. The central alarm station server 570 may receive the alerting data and route the alerting data to the terminal 572 for processing by an operator associated with the terminal 572. The terminal 572 may render a display to the operator that includes information associated with the alerting event (e.g., the lock sensor data, the motion sensor data, the contact sensor data, etc.) and the operator may handle the alerting event based on the displayed information.

In some implementations, the terminals 572 and 574 may be mobile devices or devices designed for a specific function. Although FIG. 5 illustrates two terminals for brevity, actual implementations may include more (and, perhaps, many more) terminals.

The one or more authorized user devices 540 and 550 are devices that host and display user interfaces. For instance, the user device 540 is a mobile device that hosts or runs one or more native applications (e.g., the smart home application 542). The user device 540 may be a cellular phone or a non-cellular locally networked device with a display. The user device 540 may include a cell phone, a smart phone, a tablet PC, a personal digital assistant ("PDA"), or any other portable device configured to communicate over a network and display information. For example, implementations may also include Blackberry-type devices (e.g., as provided by Research in Motion), electronic organizers, iPhone-type devices (e.g., as provided by Apple), iPod devices (e.g., as provided by Apple) or other portable music players, other communication devices, and handheld or portable electronic devices for gaming, communications, and/or data organization. The user device 540 may perform functions unrelated to the monitoring system, such as placing personal telephone calls, playing music, playing video, displaying pictures, browsing the Internet, maintaining an electronic calendar, etc.

The user device 540 includes a smart home application 542. The smart home application 542 refers to a software/firmware program running on the corresponding mobile device that enables the user interface and features described throughout. The user device 540 may load or install the smart home application 542 based on data received over a network or data received from local media. The smart home application 542 runs on mobile devices platforms, such as iPhone, iPod touch, Blackberry, Google Android, Windows Mobile, etc. The smart home application 542 enables the user device 540 to receive and process power and sensor data from the monitoring system.

The user device 550 may be a general-purpose computer (e.g., a desktop personal computer, a workstation, or a laptop computer) that is configured to communicate with the monitoring server 560 and/or the control unit 510 over the network 505. The user device 550 may be configured to display a smart home user interface 552 that is generated by the user device 550 or generated by the monitoring server 560. For example, the user device 550 may be configured to display a user interface (e.g., a web page) provided by the monitoring server 560 that enables a user to perceive data captured by the appliance monitor 534 and/or reports related to the monitoring system. Although FIG. 5 illustrates two user devices for brevity, actual implementations may include more (and, perhaps, many more) or fewer user devices.

The smart home application 542 and the smart home user interface 552 can allow a user to interface with the property monitoring system 500, for example, allowing the user to view monitoring system settings, adjust monitoring system parameters, customize monitoring system rules, and receive and view monitoring system messages.

In some implementations, the one or more user devices 540 and 550 communicate with and receive monitoring system data from the control unit 510 using the communication link 538. For instance, the one or more user devices 540 and 550 may communicate with the control unit 510 using various local wireless protocols such as Wi-Fi, Bluetooth, Z-wave, Zigbee, HomePlug (ethernet over power line), or wired protocols such as Ethernet and USB, to connect the one or more user devices 540 and 550 to local security and automation equipment. The one or more user devices 540 and 550 may connect locally to the monitoring system and its sensors and other devices. The local connection may improve the speed of status and control communications because communicating through the network 505 with a remote server (e.g., the monitoring server 560) may be significantly slower.

Although the one or more user devices 540 and 550 are shown as communicating with the control unit 510, the one or more user devices 540 and 550 may communicate directly with the sensors 520 and other devices controlled by the control unit 510. In some implementations, the one or more user devices 540 and 550 replace the control unit 510 and perform the functions of the control unit 510 for local monitoring and long range/offsite communication.

In other implementations, the one or more user devices 540 and 550 receive monitoring system data captured by the control unit 510 through the network 505. The one or more user devices 540, 550 may receive the data from the control unit 510 through the network 505 or the monitoring server 560 may relay data received from the control unit 510 to the one or more user devices 540 and 550 through the network 505. In this regard, the monitoring server 560 may facilitate communication between the one or more user devices 540 and 550 and the monitoring system 500.

In some implementations, the one or more user devices 540 and 550 may be configured to switch whether the one or more user devices 540 and 550 communicate with the control unit 510 directly (e.g., through link 538) or through the monitoring server 560 (e.g., through network 505) based on a location of the one or more user devices 540 and 550. For instance, when the one or more user devices 540 and 550 are located close to the control unit 510 and in range to communicate directly with the control unit 510, the one or more user devices 540 and 550 use direct communication. When the one or more user devices 540 and 550 are located far from the control unit 510 and not in range to communicate directly with the control unit 510, the one or more user devices 540 and 550 use communication through the monitoring server 560.

Although the one or more user devices 540 and 550 are shown as being connected to the network 505, in some implementations, the one or more user devices 540 and 550 are not connected to the network 505. In these implementations, the one or more user devices 540 and 550 communicate directly with one or more of the monitoring system components and no network (e.g., Internet) connection or reliance on remote servers is needed.

In some implementations, the one or more user devices 540 and 550 are used in conjunction with only local sensors and/or local devices in a house. In these implementations, the system 500 includes the one or more user devices 540 and 550, the sensors 520, the property automation controls 522, the appliance monitor 534, and the robotic devices 590. The one or more user devices 540 and 550 receive data directly from the sensors 520, the property automation controls 522, the appliance monitor 534, and the robotic devices 590 (i.e., the monitoring system components) and sends data directly to the monitoring system components. The one or more user devices 540, 550 provide the appropriate interfaces/processing to provide visual surveillance and reporting.

In other implementations, the system 500 further includes network 505 and the sensors 520, the property automation controls 522, the appliance monitor 534, and the robotic devices 590 are configured to communicate sensor and power data to the one or more user devices 540 and 550 over network 505 (e.g., the Internet, cellular network, etc.). In yet another implementation, the sensors 520, the property automation controls 522, the appliance monitor 534, and the robotic devices 590 (or a component, such as a bridge/router) are intelligent enough to change the communication pathway from a direct local pathway when the one or more user devices 540 and 550 are in close physical proximity to the sensors 520, the property automation controls 522, the appliance monitor 534, and the robotic devices 590 to a pathway over network 505 when the one or more user devices 540 and 550 are farther from the sensors 520, the property automation controls 522, the appliance monitor 534, and the robotic devices 590. In some examples, the system leverages GPS information from the one or more user devices 540 and 550 to determine whether the one or more user devices 540 and 550 are close enough to the monitoring system components to use the direct local pathway or whether the one or more user devices 540 and 550 are far enough from the monitoring system components that the pathway over network 505 is required. In other examples, the system leverages status communications (e.g., pinging) between the one or more user devices 540 and 550 and the sensors 520, the property automation controls 522, the appliance monitor 534, and the robotic devices 590 to determine whether communication using the direct local pathway is possible. If communication using the direct local pathway is possible, the one or more user devices 540 and 550 communicate with the sensors 520, the property automation controls 522, the appliance monitor 534, and the robotic devices 590 using the direct local pathway. If communication using the direct local pathway is not possible, the one or more user devices 540 and 550 communicate with the monitoring system components using the pathway over network 505.

In some implementations, the system 500 provides end users with access to the electrical appliance data captured by the appliance monitor 534 to aid in decision making. The system 500 may transmit the electrical appliance data captured by the appliance monitor 534 over a wireless WAN network to the user devices 540 and 550. Because transmission over a wireless WAN network may be relatively expensive, the system 500 can use several techniques to reduce costs while providing access to significant levels of useful visual information (e.g., compressing data, down-sampling data, sending data only over inexpensive LAN connections, or other techniques).

The described systems, methods, and techniques may be implemented in digital electronic circuitry, computer hardware, firmware, software, or in combinations of these elements. Apparatus implementing these techniques may include appropriate input and output devices, a computer processor, and a computer program product tangibly embodied in a machine-readable storage device for execution by a programmable processor. A process implementing these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random-access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially designed ASICs (application-specific integrated circuits).

It will be understood that various modifications may be made. For example, other useful implementations could be achieved if steps of the disclosed techniques were performed in a different order and/or if components in the disclosed systems were combined in a different manner and/or replaced or supplemented by other components. Accordingly, other implementations are within the scope of the disclosure.

What is claimed is:

1. A monitoring system that is configured to monitor a property, the monitoring system comprising:
   a sensor that is configured to generate sensor data indicating a first environmental condition of the property;
   an electrical monitoring device configured to:
      couple to an electrical cord that provides power to an electrical device located at the property, and
      generate electrical data indicating an electrical characteristic of the electrical cord including a time duration that the electrical device has been powered on; and
   a monitor control unit that is configured to:
      receive, from the sensor, the sensor data that indicates the environmental condition of the property;
      receive, from the electrical monitoring device, the electrical data;
      access, for each of one or more environmental conditions of the property that include the first environmental condition of the property, respective calibration data including expected values of the electrical characteristic of the electrical cord;
      select, from the calibration data for each of the one or more environmental conditions of the property and using the sensor data, one or more expected values of the electrical characteristic for the first environmental condition of the property;
      determine, using the electrical data, that the electrical characteristic of the electrical cord deviates from the selected one or more expected values of the electrical characteristic including determining, using the electrical data, that the time duration that the electrical device has been powered satisfies a threshold time duration; and
      in response to determining that the electrical characteristic of the electrical cord deviates from the selected one or more expected values of the electrical characteristic including determining that the time duration that the electrical device has been powered satisfies the threshold time duration, perform a monitoring system action.

2. The monitoring system of claim 1, wherein:
   the sensor is a motion detector that is configured to generate motion data; and
   the monitor control unit is configured to:
      receive the sensor data by receiving the motion data;
      based on the motion data, determine the first environmental condition of the property by determining an occupancy of the property;
      determine expected values of the electrical characteristic for the occupancy of the property; and
      in response to determining that the electrical characteristic of the electrical cord deviates from the expected values of the electrical characteristic for the occupancy of the property, perform the monitoring system action.

3. The monitoring system of claim 1, wherein the monitoring system action comprises removing power to the electrical device.

4. The monitoring system of claim 1, wherein the monitor control unit is configured to:
   determine, over a period of time, a trend of electrical data;
   based on analyzing the sensor data and the received electrical data, detect a deviation from the trend of electrical data; and
   in response to detecting the deviation from the trend of electrical data, perform the monitoring system action.

5. The monitoring system of claim 1, wherein the monitor control unit is configured to:
   receive a status of the monitoring system selected from a group comprising armed or unarmed;
   based on the sensor data and the status of the monitoring system, select the one or more expected values of the electrical characteristic for the first environmental condition of the property;
   determine that the electrical characteristic of the electrical cord deviates from the selected one or more expected values of the electrical characteristic; and
   in response to determining that the electrical characteristic of the electrical cord deviates from the selected one or more expected values of the electrical characteristic, perform the monitoring system action.

6. The monitoring system of claim 1, wherein the electrical data comprises a binary on or off status of the electrical device.

7. The monitoring system of claim 1, wherein the electrical monitoring device is configured to removably couple to an exterior of the electrical cord.

8. The monitoring system of claim 1, wherein the monitor control unit is configured to:
   determine, based on the electrical data, that the electrical device is powered on; and
   perform the monitoring system action by removing power to the electrical device.

9. The monitoring system of claim 1, wherein the monitor control unit is configured to:
   determine, based on the electrical data, that the electrical device is powered off; and
   perform the monitoring system action by providing power to the electrical device.

10. The monitoring system of claim 1, wherein the monitoring system action comprises providing a notification indicating that the electrical characteristic of the electrical cord deviates from the selected one or more expected values of the electrical characteristic.

11. The monitoring system of claim 1, wherein the electrical characteristic of the electrical cord comprises a measured current or a measured voltage of the electrical cord.

12. The monitoring system of claim 1, wherein the selected one or more expected values of the electrical characteristic of the electrical cord comprise a range of expected values.

13. The monitoring system of claim 12, wherein determining that the electrical characteristic of the electrical cord deviates from the selected one or more expected values comprises determining that a measured value of the electrical characteristic does not satisfy the range of expected values.

14. The monitoring system of claim 1, wherein the first environmental condition includes at least one of a lighting level, a water level, or an air quality of the property.

15. A computer implemented method comprising:
   receiving, from a sensor, sensor data that indicates a first environmental condition of a property;
   receiving electrical data from an electrical monitoring device configured to couple to an electrical cord that provides power to an electrical device located at the property, wherein the electrical data indicates an electrical characteristic of the electrical cord including a time duration that the electrical device has been powered on;
   accessing, for each of one or more environmental conditions of the property that include the first environmental condition of the property, respective calibration data including expected values of the electrical characteristic of the electrical cord;

selecting, from the calibration data for each of the one or more environmental conditions of the property and using the sensor data, one or more expected values of the electrical characteristic for the first environmental condition of the property;

determining, using the electrical data, that the electrical characteristic of the electrical cord deviates from the selected one or more expected values of the electrical characteristic including determining, using the electrical data, that the time duration that the electrical device has been powered satisfies a threshold time duration; and in response to determining that the electrical characteristic of the electrical cord deviates from the selected one or more expected values of the electrical characteristic including determining that the time duration that the electrical device has been powered satisfies the threshold time duration, performing a monitoring system action.

16. The method of claim 15, wherein:

the sensor is a motion detector that is configured to generate motion data; and the method comprises:

receiving the sensor data by receiving the motion data;

based on the motion data, determining the first environmental condition of the property by determining an occupancy of the property;

determining expected values of the electrical characteristic for the occupancy of the property; and in response to determining that the electrical characteristic of the electrical cord deviates from the expected values of the electrical characteristic for the occupancy of the property, performing the monitoring system action.

17. The method of claim 15, wherein the monitoring system action by removing power to the electrical device.

18. The method of claim 15, comprising:

determining, over a period of time, a trend of electrical data;

based on analyzing the sensor data and the received electrical data, detecting a deviation from the trend of electrical data; and in response to detecting the deviation from the trend of electrical data, performing the monitoring system action.

19. The method of claim 15, wherein the electrical characteristic of the electrical cord comprises a measured current or a measured voltage of the electrical cord.

20. A non-transitory computer storage medium encoded with instructions that, when executed by one or more computers, cause the one or more computers to perform operations comprising:

receiving, from a sensor, sensor data that indicates a first environmental condition of a property;

receiving electrical data from an electrical monitoring device configured to couple to an electrical cord that provides power to an electrical device located at the property, wherein the electrical data indicates an electrical characteristic of the electrical cord including a time duration that the electrical device has been powered on;

accessing, for each of one or more environmental conditions of the property that include the first environmental condition of the property, respective calibration data including expected values of the electrical characteristic of the electrical cord;

selecting, from the calibration data for each of the one or more environmental conditions of the property and using the sensor data, one or more expected values of the electrical characteristic for the first environmental condition of the property;

determining, using the electrical data, that the electrical characteristic of the electrical cord deviates from the selected one or more expected values of the electrical characteristic including determining, using the electrical data, that the time duration that the electrical device has been powered satisfies a threshold time duration; and in response to determining that the electrical characteristic of the electrical cord deviates from the selected one or more expected values of the electrical characteristic including determining that the time duration that the electrical device has been powered satisfies the threshold time duration, performing a monitoring system action.

* * * * *